(12) United States Patent
Pal

(10) Patent No.: US 8,427,214 B2
(45) Date of Patent: Apr. 23, 2013

(54) CLOCK STATE INDEPENDENT RETENTION MASTER-SLAVE FLIP-FLOP

(75) Inventor: Sumana Pal, Bangalore (IN)

(73) Assignee: ARM Limited, Cambridge (GB)

( * ) Notice: Subject to any disclaimer, the term of this patent is extended or adjusted under 35 U.S.C. 154(b) by 149 days.

(21) Appl. No.: 12/929,071

(22) Filed: Dec. 28, 2010

(65) Prior Publication Data

US 2011/0298516 A1 Dec. 8, 2011

Related U.S. Application Data

(60) Provisional application No. 61/351,203, filed on Jun. 3, 2010.

(51) Int. Cl.
*H03K 3/289* (2006.01)

(52) U.S. Cl.
USPC ............ 327/202; 327/203; 327/208; 327/218

(58) Field of Classification Search .................. 327/199, 327/202, 203, 208, 210–212, 214, 215, 218, 327/219, 225
See application file for complete search history.

(56) References Cited

U.S. PATENT DOCUMENTS

| | | | |
|---|---|---|---|
| 5,831,463 A | 11/1998 | Sachdev | |
| 6,246,265 B1 | 6/2001 | Ogawa | |
| 6,492,854 B1 | 12/2002 | Ku et al. | |
| 2004/0075479 A1* | 4/2004 | Gupta | 327/202 |
| 2006/0152268 A1 | 7/2006 | Flynn et al. | |
| 2007/0103217 A1 | 5/2007 | Frederick et al. | |
| 2009/0058484 A1* | 3/2009 | Rao et al. | 327/202 |
| 2011/0248759 A1 | 10/2011 | Chi et al. | |
| 2012/0229187 A1 | 9/2012 | Choudhury et al. | |

OTHER PUBLICATIONS

Tufekcic, "Control Power ARM PMK and Cadence Low Power Flow", www.iqmagazineonline.com, May 2007, 25 pages.
Mahmoodi-Meimand et al., "Data-Retention Flip-Flops for Power-Down Applications", *2004 IEEE*, (No Date), pp. II-677-II 680.
Shi, "Area and Power-Delay Efficient State Retention Pulse-triggered Flip-flops with Scan and Reset Capabilities", *2008 IEEE*, (No Date) pp. 170-175.
Zhao et al., "External-Internal Dual Switch Leakage Controlled Flip-Flop", *Ctr. for Advanced Computer Studies*, (No Date), pp. 1-20.
Bai et al., "Fault Modeling and Testing of Retention Flip-Flops in Lower Power Designs", *2009 IEEE*, (No Date) pp. 684-689.
Henzler et al., "Dynamic State-Retention Flip-Flop for Fine-Grained Power Gating With Small Design and Power Overhead", *IEEE Journal of Solid-State Circuits*, vol. 41, No. 7, Jul. 2006, pp. 1654-1661.
Keating et al., "Low Power Methodology Manual for System-On-Chip Design", *Springer*, 2007, pp. 210-218.
U.S. Appl. No. 13/067,452, filed Jun. 1, 2011, Pal.
Notice of Allowance mailed Dec. 14, 2012 in co-pending U.S. Appl. No. 13/067,452.

* cited by examiner

*Primary Examiner* — Long Nguyen
(74) *Attorney, Agent, or Firm* — Nixon & Vanderhye P.C.

(57) ABSTRACT

A master-slave flip-flop circuit is provided with a retention capability to support operation in both a normal mode and a retention mode. During the retention mode the retention circuitry drives the output signal via either a first path 16 or a second path 22, 24, 4, 10 in dependence upon the phase of the clock signal. During both phases of the clock signal the output signal is driven in a well defined state to reflect the signal stored within the retention circuitry. There is thus provided a clock independent retention master-slave flip-flop circuit. Both high density and high speed variants of the flip-flop circuit may use the technique.

17 Claims, 12 Drawing Sheets

High Density D Flip-flop (active-low Reset)

High Density D Flip-flop (active-low set)

High Density D Flip-flop (active-low set-reset)

High Speed D Flip-flop (active-high Reset)

High Speed D Flip-flop (active-low Set)

High Speed D Flip-flop (active-low Set active-high Reset)

CLOCK STATE INDEPENDENT RETENTION MASTER-SLAVE FLIP-FLOP

This application claims priority to US Provisional Application No. 61/351,203, filed Jun. 3, 2010, the entire contents of which are hereby incorporated by reference.

BACKGROUND OF THE INVENTION

1. Field of the Invention

This invention relates to the field of master-slave flip-flop circuits. More particularly, this invention relates to master-slave retention flip-flop circuits which operate in a normal mode controlled by a clock signal and in a retention mode in which the slave state is maintained and less power consumed.

2. Description of the Prior Art

FIG. 1 of the accompanying drawings illustrates one known master-slave retention flip-flop circuit. In this circuit the received clock signal is combined in an AND gate 2 with a retention signal to produce the local clock signals cn and c which are used to control the master/slave retention flip-flop circuit. When the retention signal input to the AND gate 2 goes low, the local clock signals supplied to the flip-flop are held static and so the data output by the slave stage of the flip-flop remains constant.

A problem with this circuit is that, if the clock signal input to the AND gate 2 is high and the retention signal goes from low to high, then there will be a transition in the local clock signals cn and c which control the flip-flop circuitry. This is functionally incorrect as the output of the flip-flop circuit should not change when the clock signal input to the AND gate 2 is steady.

FIG. 2 of the accompanying drawings illustrates another known design of a master-slave retention flip-flop circuit. The operation of this circuit is such that, if the clock signal CK is high, then the retained data within the retention latch (dark inverters) will pass to the output Q and the output of the master stage will be blocked by the tri-state inverter in the master latch.

A problem with this circuit is, if the clock signal CK is low and a local power up occurs while in the retention mode, then the value driven to the output Q is not well defined.

An object of the present invention is to provide a clock independent master-slave flip-flop circuit that has correct functional behaviour for a flip-flop and a well defined output independent of the clock signal level.

SUMMARY OF THE INVENTION

Viewed from one aspect the present technique provides a master-slave flip-flop circuit for receiving an input signal and for generating an output signal, said master-slave flip-flop circuit being controlled by a clock signal having a first phase and a second phase, having a normal mode of operation and a retention mode of operation and comprising:

a master stage configured to receive during said normal mode said input signal during said first phase of said clock signal and to store at a master node during said second phase of said clock signal a master signal with a value dependent upon said input signal;

control circuitry coupled to said master node and to a slave node and configured to isolate said slave node from said master node during said first phase of said clock signal and to drive said slave node during said second phase of said clock signal to have a slave signal with a value dependent upon said master signal, said output signal having a value dependent upon said slave signal;

a slave stage configured to receive during said normal mode said slave signal during said second phase of said clock signal and to store said slave signal at said slave node during said first phase of said clock signal; and retention circuitry coupled to said slave stage and configured to maintain said output signal during said retention mode, wherein said retention circuitry is configured such that:

(i) during said retention mode and said first phase of said clock signal, said retention circuitry drives said slave node so as to maintain said output signal via a first path; and (ii) during said retention mode and said second phase of said clock signal, said retention circuitry drives said slave node so as to maintain said output signal via a second path passing through said master node and said control circuitry that drives said slave node during said normal mode, said second path being different from said first path.

The present technique seeks to provide clock independence of the output from the retention circuitry by the use of two separate paths to drive the slave node from which the output signal is derived with these two different paths being used in respective different phases of the clock signal.

It will be appreciated that the first path may follow different routes depending upon the embodiment. In some embodiments the first path passes through a portion of the slave stage that drives the slave node during the normal mode.

In a similar way, it will be appreciated that the second path could take a variety of different routes. In some embodiments the second path passes through a portion of the master stage that drives the master node during the normal mode.

The slave stage may be conveniently formed using a first slave inverter in a feedback combination.

In such embodiments the retention circuitry may include a slave transmission gate disposed so as to isolate the slave inverters from the slave node during the retention mode.

The retention circuitry may further include a first retention inverter for providing feedback in combination with the first slave inverter during the retention mode of operation.

In a similar manner, the master stage may be formed of two master inverters in a feedback arrangement.

With this arrangement, the retention circuitry may comprise a second retention inverter serving to couple a remote slave signal from a remote slave node within the slave stage to drive the input signal received by the first master inverter during the retention mode.

This forms part of the second path used by the retention circuitry during the retention mode and the second phase of the clock signal.

The control circuitry which divides the master stage from the slave stage in dependence upon the clock signal can have a variety of different forms. In some embodiments, this comprises a control inverter (a tri-stateable inverter) which selectively couples the master node to the slave node in dependence upon the phase of the clock signal.

In other embodiments the control circuitry comprises a control transmission gate which similarly selectively couples the master node to the slave node in dependence upon the phase of the clock signal.

At the input of the flip-flop circuitry there maybe provided input gating circuitry which serves to receive the input signal to the flip-flop circuitry and to selectively pass this to the master signal in dependence upon whether the flip-flop circuit is in the retention mode and the phase of the clock signal. More particularly, the input gating circuitry will transmit during the normal mode when the clock signal is in its first phase, but not when the clock signal is in its second phase. The input gating circuitry will isolate when either the flip-flop circuitry is in the retention mode or the clock signal is in its second phase.

The input gating circuitry can have a variety of different forms. In some embodiments the input gating circuitry may be formed as a transistor stack with the gates of these transistors being controlled by the input signal, the clock signal and a retention mode signal controlling whether the flip-flop circuitry is in the retention mode or the normal mode.

In other embodiments the input gating circuitry may comprise an input inverter tri-statable in dependence upon whether the flip-flop circuitry is in the retention mode and connected in series with input transmission gate circuitry that serves to block transmission during the second phase of the clock signal.

The output signal of the flip-flop circuitry may be derived from the slave node. The output signal may be derived via one or two inverters depending upon the polarity of the slave node relative to the desired output signal.

Viewed from another aspect the present invention provides a master-slave flip-flop circuit for receiving an input signal and for generating an output signal, said master-slave flip-flop circuit being controlled by a clock signal having a first phase and a second phase, having a normal mode of operation and a retention mode of operation and comprising:

master stage means for receiving during said normal mode said input signal during said first phase of said clock signal and for storing at a master node during said second phase of said clock signal a master signal with a value dependent upon said input signal;

control means coupled to said master node and to a slave node for isolating said slave node from said master node during said first phase of said clock signal and for driving said slave node during said second phase of said clock signal to have a slave signal with a value dependent upon said master signal, said output signal having a value dependent upon said slave signal;

slave stage means for receiving during said normal mode said slave signal during said second phase of said clock signal and for storing said slave signal at said slave node during said first phase of said clock signal; and retention means coupled to said slave stage means for maintaining said output signal during said retention mode, wherein
said retention means is configured such that:
(i) during said retention mode and said first phase of said clock signal, said retention circuitry drives said slave node so as to maintain said output signal via a first path; and
(ii) during said retention mode and said second phase of said clock signal, said retention circuitry drives said slave node so as to maintain said output signal via a second path passing through said master node and said control means that drives said slave node during said normal mode, said second path being different from said first path.

Viewed from a further aspect the present invention provides a method of operating a master-slave flip-flop circuit for receiving an input signal and for generating an output signal, said master-slave flip-flop circuit being controlled by a clock signal having a first phase and a second phase, having a normal mode of operation and a retention mode of operation, said method comprising the steps of:

receiving at a master stage during said normal mode said input signal during said first phase of said clock signal and storing at a master node during said second phase of said clock signal a master signal with a value dependent upon said input signal;

with control circuitry isolating a slave node from said master node during said first phase of said clock signal and driving said slave node during said second phase of said clock signal to have a slave signal with a value dependent upon said master signal, said output signal having a value dependent upon said slave signal;

receiving at a slave stage during said normal mode said slave signal during said second phase of said clock signal and storing said slave signal at said slave node during said first phase of said clock signal; and maintaining said output signal during said retention mode by:
(i) during said retention mode and said first phase of said clock signal, driving said slave node so as to maintain said output signal via a first path; and
(ii) during said retention mode and said second phase of said clock signal, driving said slave node so as to maintain said output signal via a second path passing through said master node and said control circuitry that drives said slave node during said normal mode, said second path being different from said first path.

The above, and other objects, features and advantages of this invention will be apparent from the following detailed description of illustrative embodiments which is to be read in connection with the accompanying drawings.

DESCRIPTION OF THE EMBODIMENTS

Figure 1:
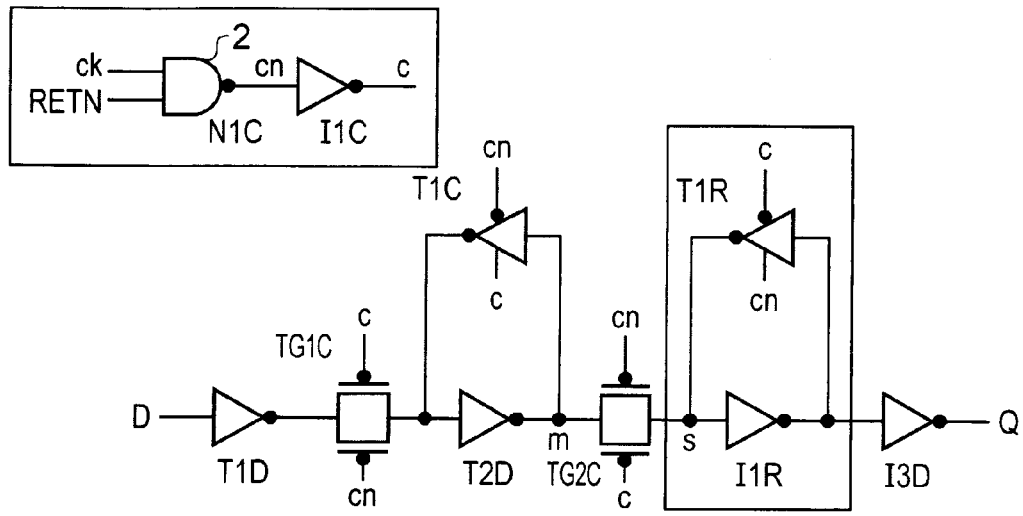
FIGS. 1 and 2 schematically illustrates prior art master-slave retention flip-flop circuits.
Figure 2:
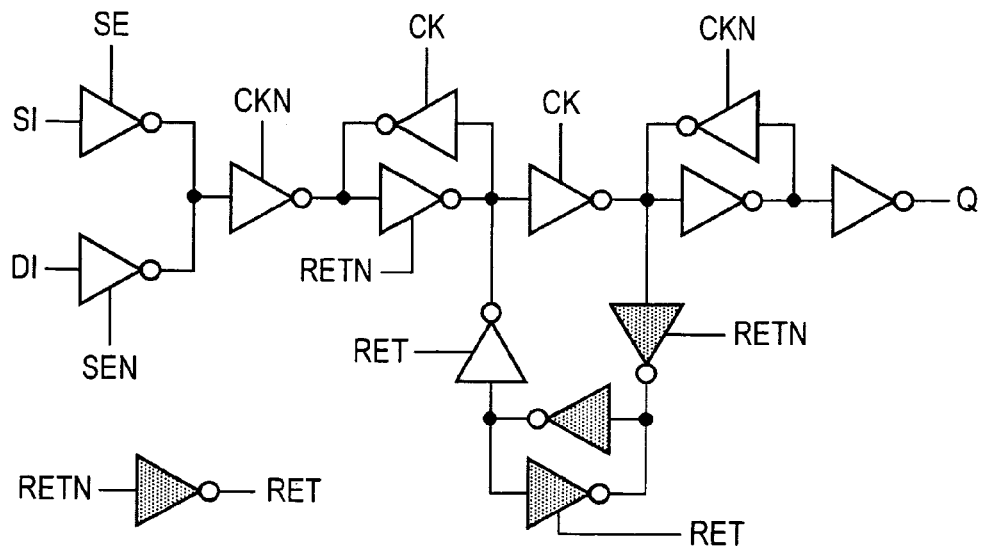
Figure 3:
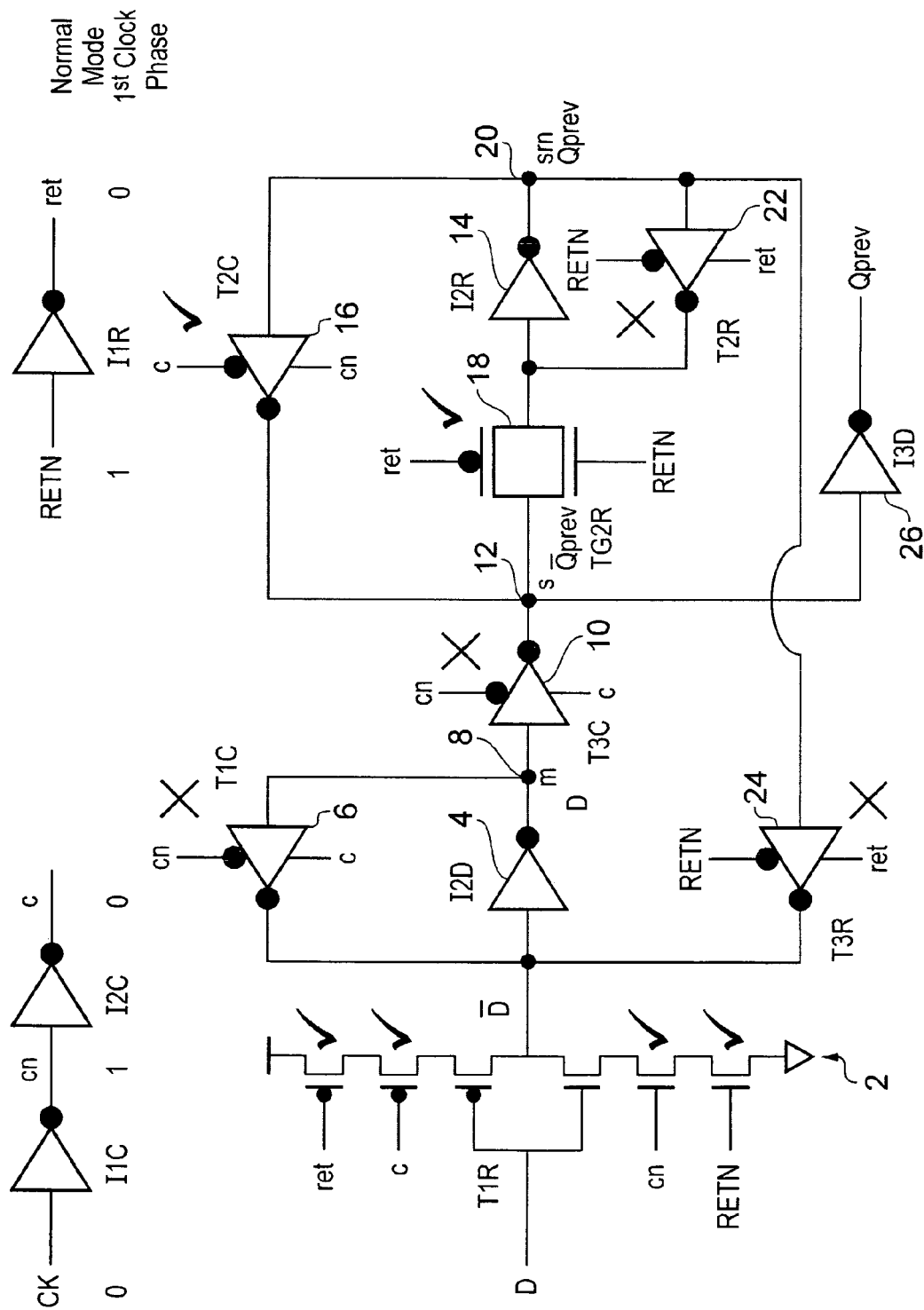
FIGS. 3 to 6 schematically illustrate a high density variant of a master-slave retention flip-flop circuit.

FIG. 3 schematically illustrates a high density variant of a master-slave retention flip-flop circuit that is clock state independent. The flip-flop circuit of FIG. 3 operates in either a normal mode in which it responds to the first phase of the clock signal CK to capture the input signal D which is supplied to input gating circuitry 2 and pass this to a master stage including a first master inverter 4 and a second master-inverter 6. The inverters shown in the Figures with the clock signal (cn, c) or a retention mode signal (RETN, ret) input thereto are tri-stateable inverters as will be familiar to those in this technical field.

The output of the first master inverter 4 is supplied to a master node 8. Control circuitry 10 in the form of a control inverter tri-stated in response to the clock signal serves to either isolate a master signal present at the master node 8 during a first phase of the clock signal CK or to pass (and invert) the master signal through to a slave node 12 during a second phase of the clock signal CK.

The slave stage includes a first slave inverter 14 and a second slave inverter (tri-stateable) 16. The second slave inverter 16 is controlled with the opposite phase of the clock signal CK compared to the second master-inverter 6 such that the slave stage serves to receive the slave signal at the slave node 12 during the second phase of the clock signal and to store the slave signal during the first phase of the clock signal.

A slave transmission gate 18 is controlled by the retention mode signal RETN, ret to isolate the slave node 12 from the first slave inverter 14 during the retention mode and to connect the slave node 12 to the first inverter 14 during the normal mode of operation.

The output of the first slave inverter 14 is supplied to a remote slave node 20 and forms a remote slave signal. This remote slave signal is input to a first retention inverter 22 which is active during the retention mode in a feedback arrangement with the first slave inverter 14 to retain the remote slave signal at the remote slave node 20.

A second retention inverter 24 is active during the retention mode to transmit the remote slave signal at remote slave node 20 to the input of the first master inverter 4. During the second phase of the clock signal CK, the control inverter 10 is transmissive and accordingly the signal fed along the signal path through the second retention inverter 24 will pass through the first master inverter 4 and the control inverter 10 to the slave node 12 from where it will be further passed to an output inverter 26 before forming the output signal Q.

When in the retention mode and during the first phase of the clock signal CK, the control inverter 10 will serve to isolate the master node 8 from the slave node 12 blocking this signal path. However, during this first phase of the clock signal CK, the second slave inverter 16 will be transmissive and accordingly the remote slave signal from remote slave node 20 will pass along a path through the second slave inverter 16 to the slave node 12 and then out through the output inverter 26 to form the output signal Q.

In this example embodiment, the output gating circuitry 2 is formed of a transistor stack. The gates of the transistors in this stack are controlled by the retention mode signal, the clock signal and the input signal as illustrated.

The slave transmission gate 18, the first slave inverter 14 and the first retention inverter 22 are formed as high voltage threshold devices so as to reduce power consumption during the retention mode. Inverters for forming the different phases of the clock signal CK and the retention mode signal RETN, ret are shown at the top of FIG. 3.

Also shown in FIG. 3 are ticks and crosses indicating whether the devices controlled by the clock signal and the retention mode signal are on or off during the normal mode of operation and the first phase of the clock signal. As will be seen, during this first phase of the clock signal in normal mode, the feedback through the second master inverter 6 in the master stage is switched off allowing the input signal in inverted form to be captured into the master stage and stored at the master node 8. The control inverter 10 is non-transmissive at this time and accordingly the input signal is not passed to the slave stage. The slave stage is shown with the second slave inverter 16 switched on so as to form a feedback loop with the first slave inverter 14 passing through the slave transmission gate 18 which is transmissive during the normal mode. Thus, the output signal from the previous cycle continues to be stored and supplied through the output inverter 26 to form the output signal $Q_{prev}$.

Figure 4:
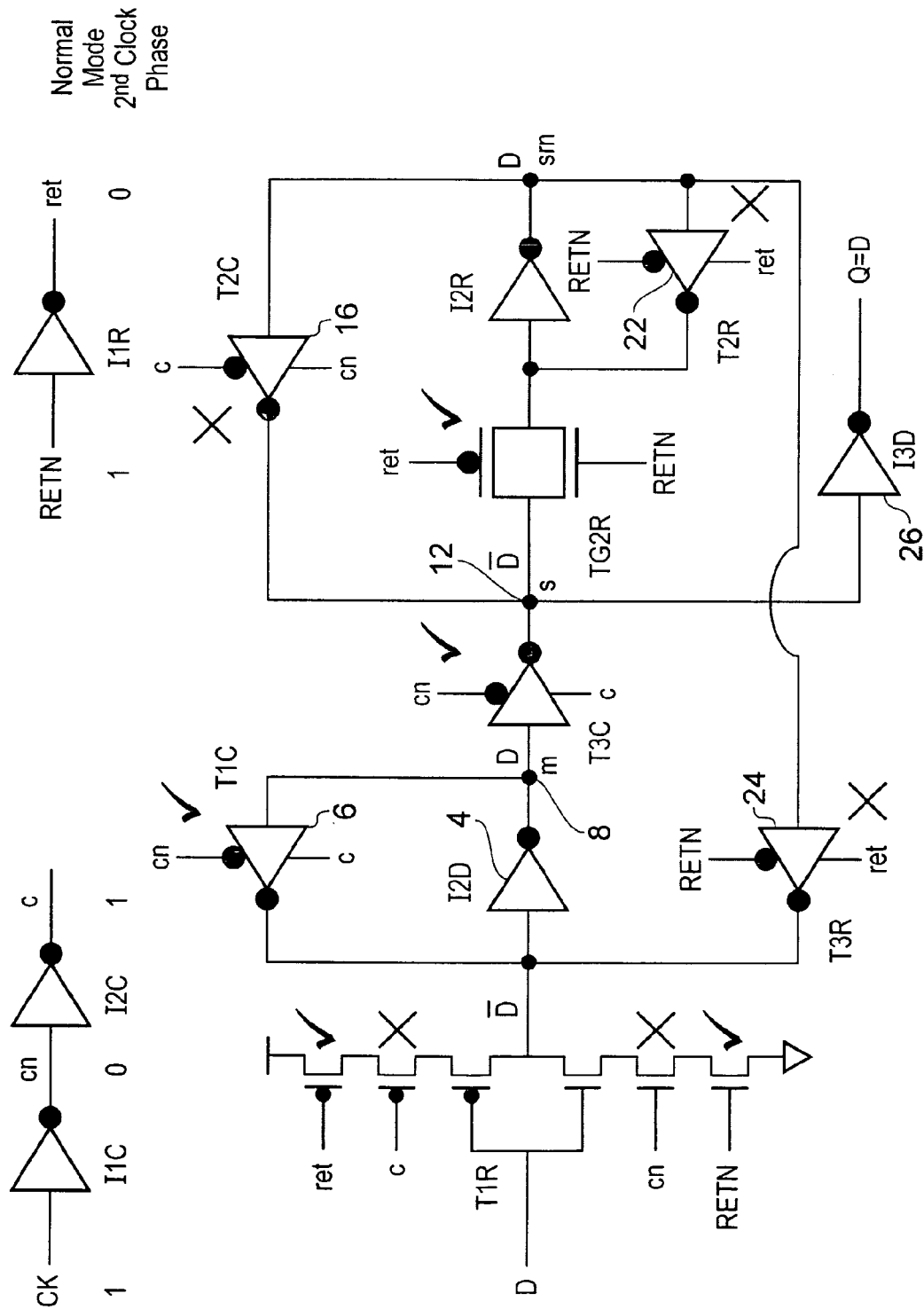

FIG. 4 illustrates the circuit of FIG. 3, but in this case during the normal mode and the second phase of the clock signal. During this phase of the clock signal in the normal mode the second master inverter 6 is switched on such that the master stage serves to store the master signal at master node 8. The second master inverter 6 and the first master inverter 4 operate in feedback. The second slave inverter 16 is switched off such that the slave signal at slave node 12 is captured into the slave stage. The first retention inverter 22 and the second retention inverter 24 are switched off. The slave signal at the slave node 12 is passed through the output inverter 26 to form the output signal Q, which is the same as the input signal D captured during the first phase of the clock signal.

Figure 5:
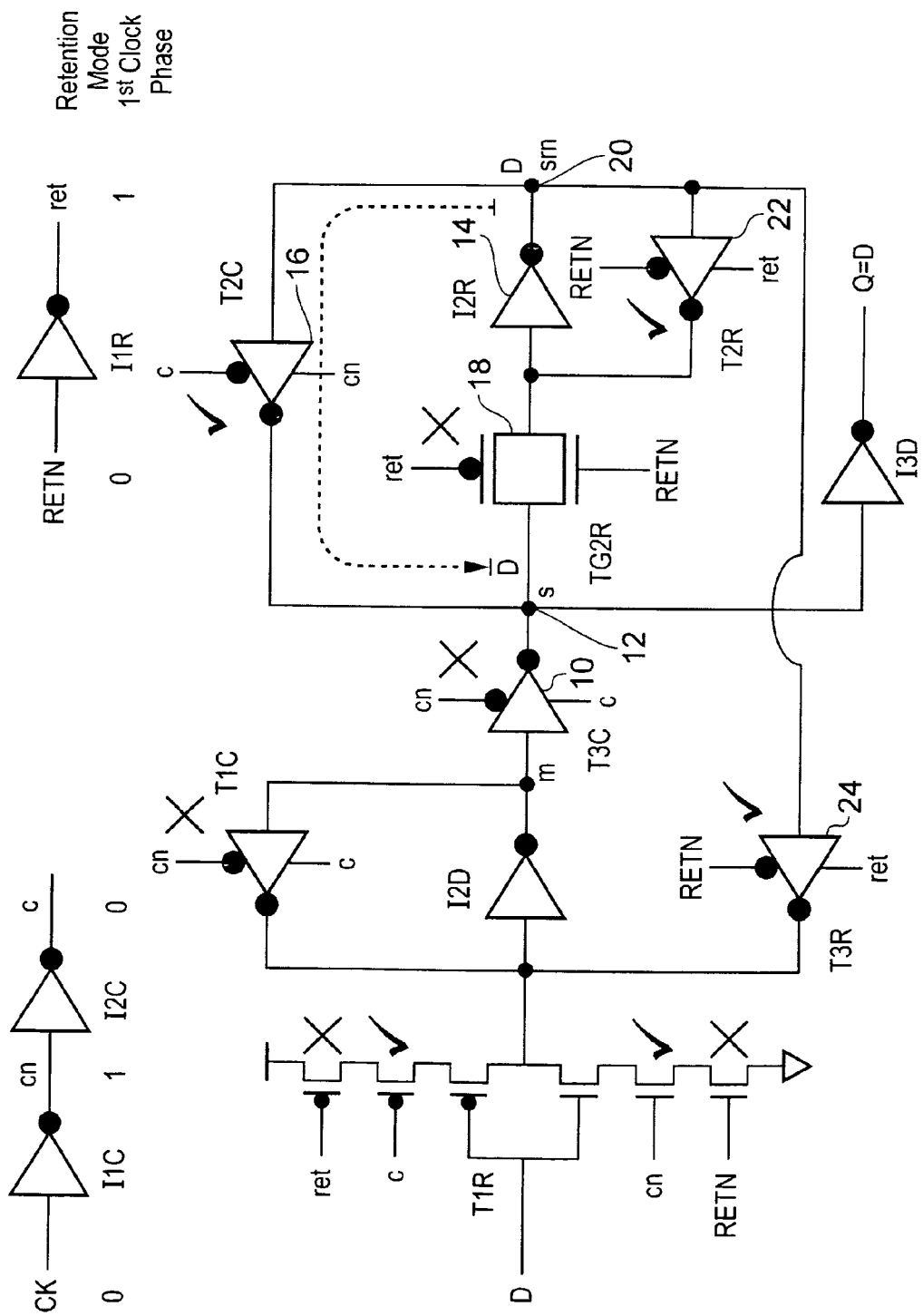

FIG. 5 illustrates the circuit of FIG. 3 during the retention mode and the first phase of the clock signal. The first retention inverter 22 and the second retention inverter 24 are switched on. The control inverter 18 is non-transmissive and serves to isolate the slave node 12 from the input to the first slave inverter 14. The control inverter 10 is non-transmissive due to the state of the clock signal. The retention circuitry in this mode serves to provide feedback between the first retention inverter 22 and the first slave inverter 14 which maintains the remote slave node signal at the remote slave node 20. This remote slave signal passes along a first path through the second slave inverter 16 which is switched on during the first clock phase to reach the slave node 12 from where it is able to drive the output.

Figure 6:
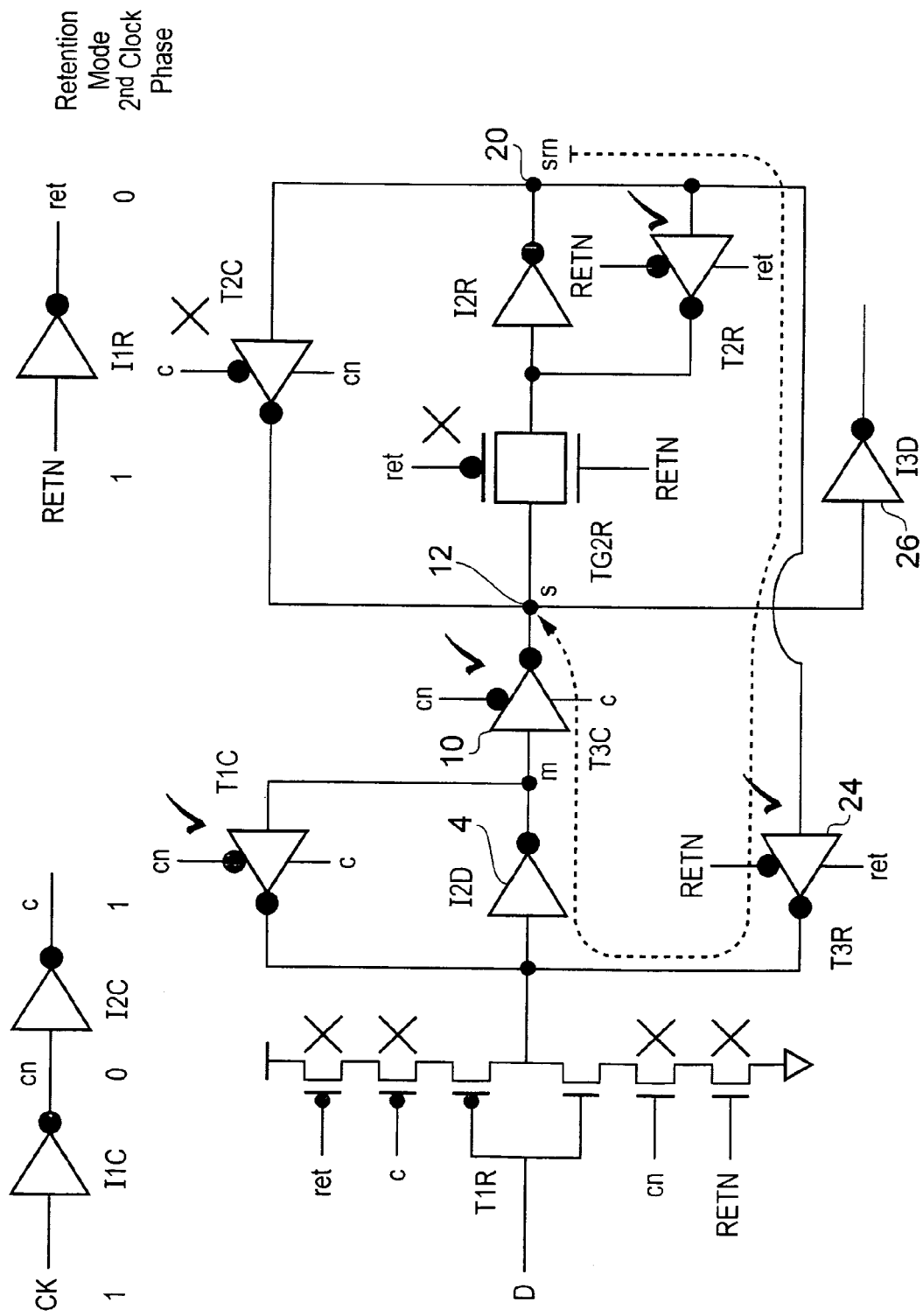

FIG. 6 illustrates the circuit of FIG. 3 in the retention mode and the second phase of the clock signal. In this mode the control inverter 10 is switched on and the second slave inverter 16 is switched off. Accordingly, a second path serves to pass the remote slave signal from the remote slave node 20 through the second retention inverter 24, the first master inverter 4 and the control inverter 10 to the slave node 12 from where it serves to drive the output signal Q through the output inverter 26.

The action of the input gating circuitry 2 formed as a transistor stack is to pass the input signal D to the input of the first master inverter 4 during the normal mode and the first phase of the clock signal. This is illustrated in FIG. 3. In the operational states illustrated in FIGS. 4, 5, and 6, the input gating circuitry 2 serves to isolate the input signal D from the input to the first master inverter 4 since at least one pair of transistors within the transistor stack is non-conductive and so the transistor stack is unable to drive the input to the first master inverter 4 either high or low.

Figure 7:
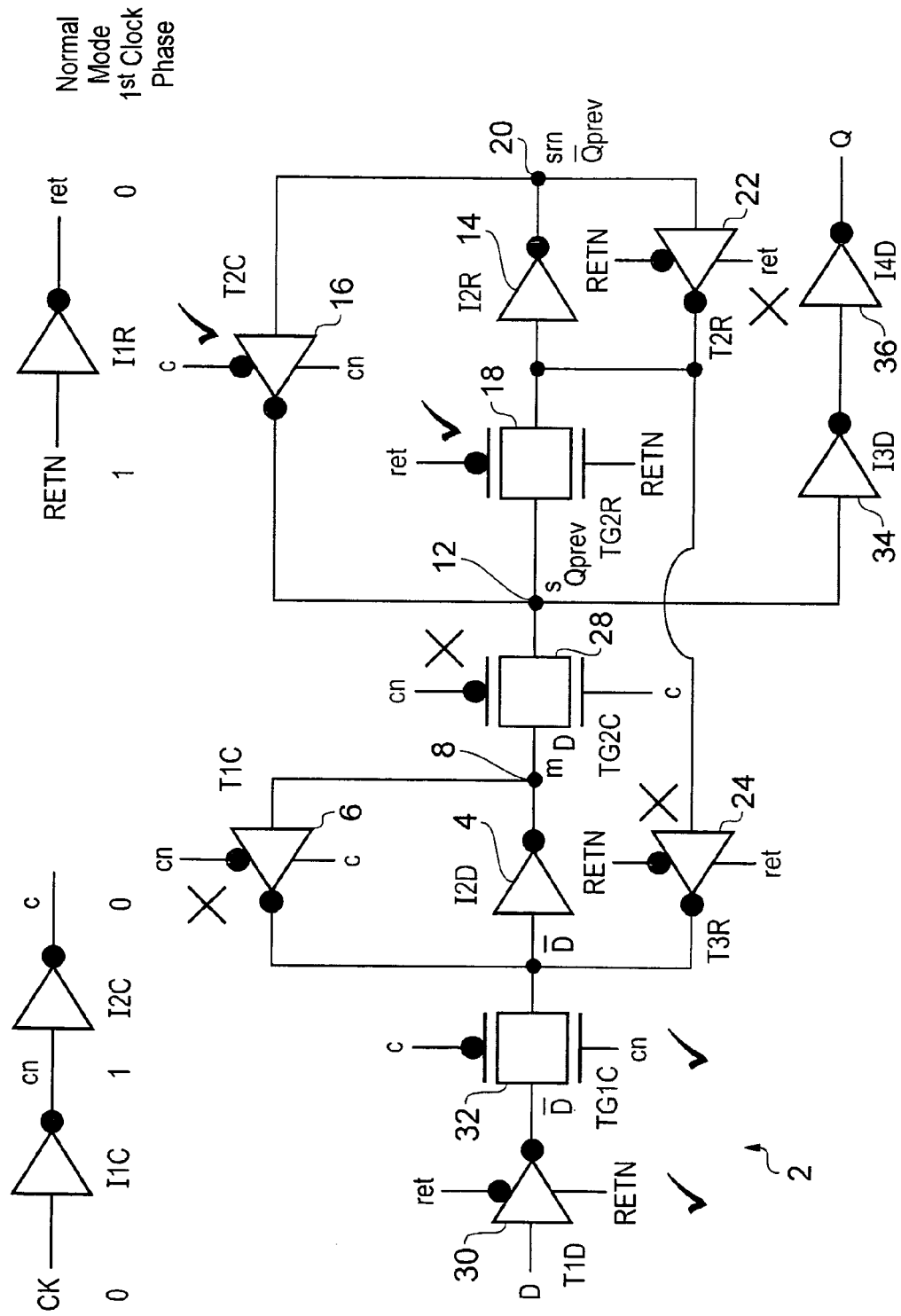
FIGS. 7 to 10 schematically illustrate a high speed variant of a master-slave retention flip-flop circuit.

FIG. 7 schematically illustrates a high speed variant of a clock state independent master-slave retention flip-flop circuit. This embodiment is similar to that of FIG. 3 with like elements numbered in common. The input gating circuitry 2 in this embodiment is formed of an input inverter 30 (tri-stateable under control of the retention mode signal) connected in series with an input transmission gate 32. The input transmission gate 32 is controlled by the clock signal CK. The combined action of the input inverter 30 and the input transmission gate 32 is to pass the input signal D to the input of the first master inverter 4 during normal mode when the clock signal is in its first phase. If the circuit of FIG. 7 is operating in the retention mode or the clock signal is in its second phase, then the input gating circuitry 2 is non-transmissive and isolates the input signal D from the input to the first master inverter 4.

In the embodiment of FIG. 7, the control circuit takes the form of a control transmission gate 28 which is switched between a transmissive and a non-transmissive state by the clock signal CK. During the first phase of the clock signal, the control transmission gate 28 is non-transmissive. During the second phase of the clock signal (as shown in FIG. 8) the control transmission gate 28 is transmissive and the master signal from the master node 8 is transferred to the slave node 12 where it forms the slave signal.

The control transmission gate 28 does not invert the master signal when this is passed to form the slave signal. In order to accommodate this is that the output signal Q is taken from the slave node 12 via a first output inverter 34 and a second output inverter 36 such that it has the same polarity as the slave signal on the slave node 12.

In the state of the circuit illustrated in FIG. 7 the input signal D is received into the master stage of the flip-flop circuit and is stored therein. The control circuit in the form of the control transmission gate 28 isolates the master node 8 from the slave node 12. The slave stage during this first clock phase serves to store the slave signal at the slave node via the action of feedback between the first slave inverter 14 and the second slave inverter 16. The output signal Q is derived via the first output inverter 34 and the second output inverter 36 as a non-inverted form of the slave signal at slave node 12.

Figure 8:
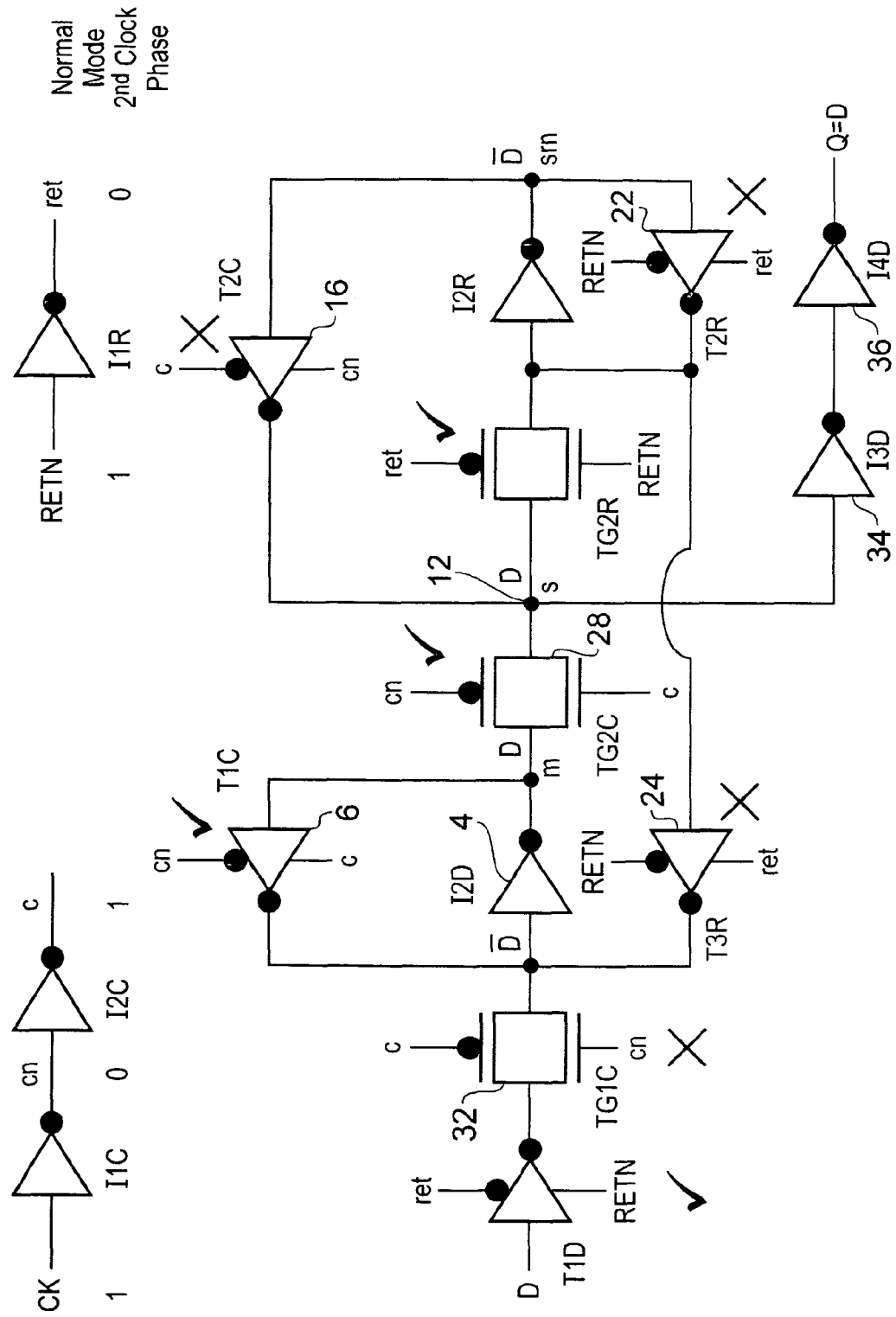

FIG. 8 illustrates the state of the flip-flop circuit during the normal mode and the second phase of the clock signal. In this case the second master inverter 6 has switched on and the second slave inverter 16 has switched off. The control circuit provided by the control transmission gate 28 is transmissive. The input transmission gate 32 is non-transmissive.

As shown in FIG. 8 during the normal mode and the second phase of the clock signal the master stage stores the master signal (which is passed via the control transmission gate 28 to the slave node 12) through feedback between the first master inverter 4 and the second master inverter 6. The slave stage receives the output of the control transmission gate 28 during the second phase of the clock signal and this is output via the first output inverter 34 and the second output inverter 36 to form the output signal Q.

During operation as illustrated in both FIG. 7 and FIG. 8, the first retention inverter 22 and the second retention inverter 24 remain switched off (non-transmissive/tri-stated).

Figure 9:
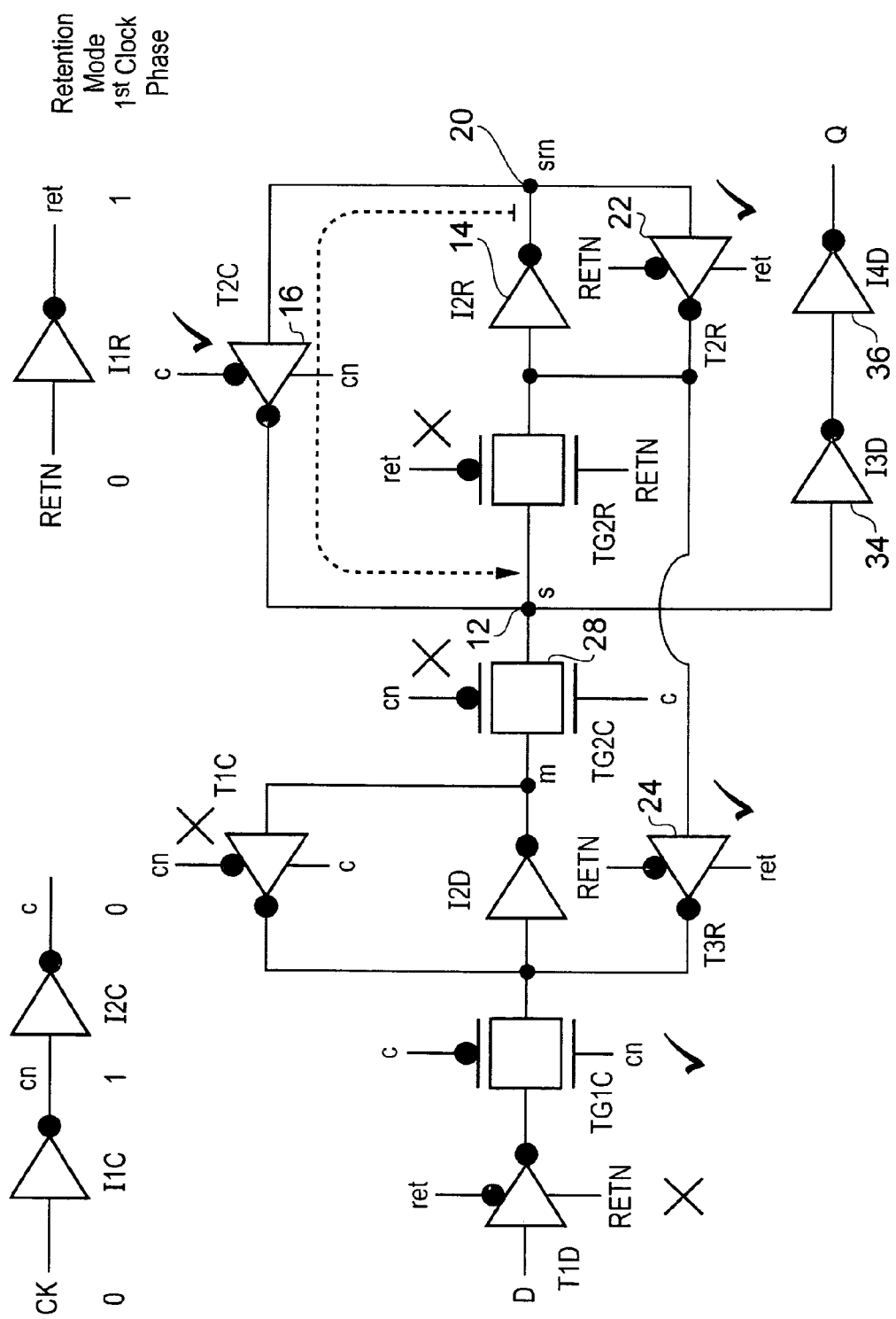

FIG. 9 illustrates the circuit of FIG. 7 operating in the retention mode during the first clock phase. In this state the first retention inverter 22 and the second retention inverter 24 are both switched on. The control transmission gate 28 is switched off by virtue of the phase of the clock signal CK. The first retention inverter and the first slave inverter 14 serve to store the remote slave signal at the remote slave node 20 through their combined feedback. A first path is provided for the remote slave signal at remote slave node 20 to drive the output signal Q through the second slave inverter 16 which is switched on by the first phase of the clock signal CK. Thus, the remote slave signal is inverted as it passes through the second slave inverter 16 and then drives the signal on the slave node 12. The slave signal on the slave node 12 drives the output signal Q via the first output inverter 34 and the second output inverter 36.

Figure 10:
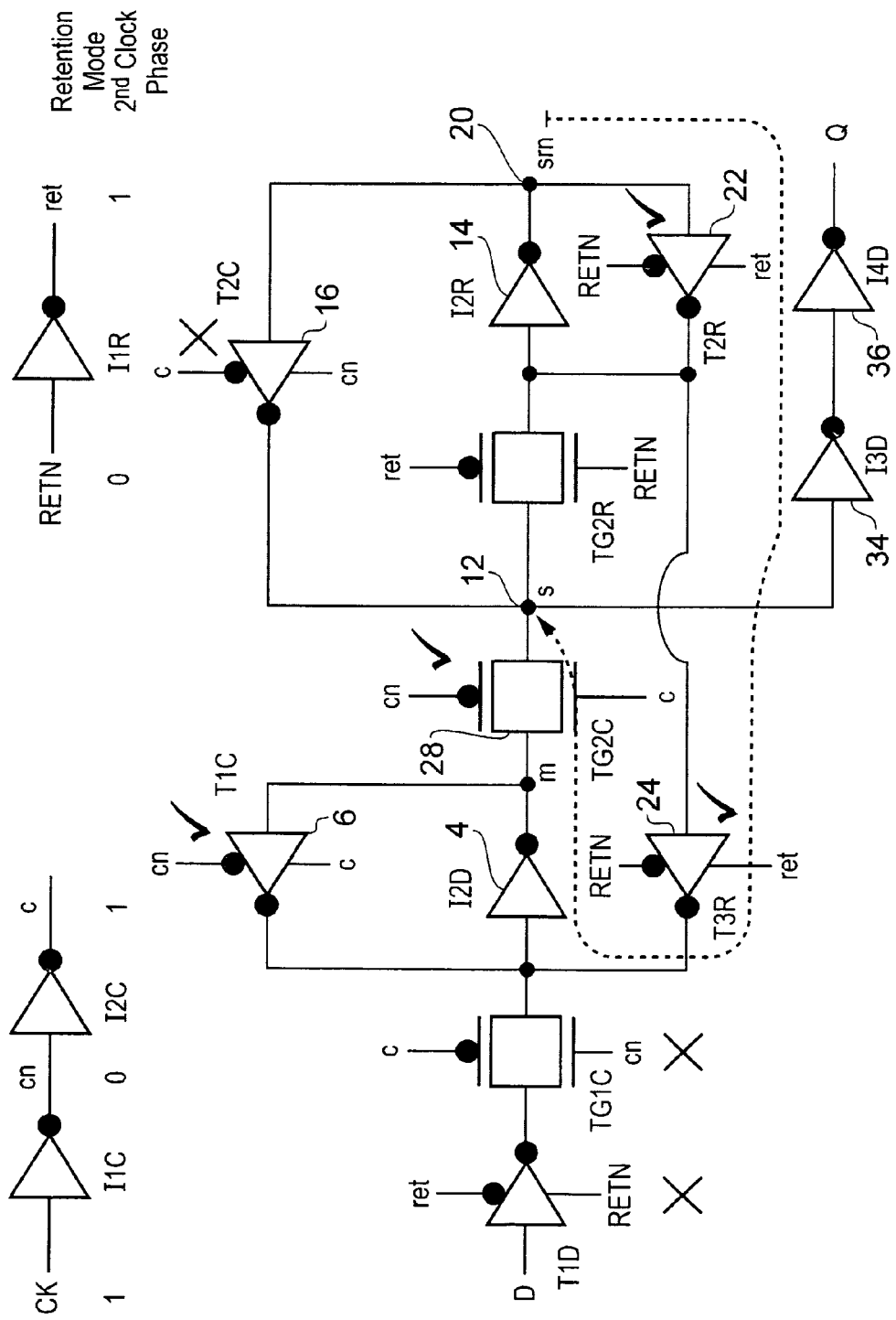

In FIG. 10 the operation of the circuit of FIG. 7 is illustrated during the retention mode and the second phase of the clock signal CK. In this state the second slave inverter 16 is switched off, the control transmission gate 28 is switched on and the second master inverter 6 is switched on. The first retention inverter 22 and the second retention inverter 24 are also switched on. As illustrated, a second signal path is formed from the remote slave node 20 via the first retention inverter 22, the second retention inverter 24, the first master inverter 4 and the control transmission gate 28 to the slave node 12. Thus, the remote slave signal at the remote slave node 20 is driven to the slave node 12 and inverted due to the odd number of inverters through which the signal passes on route. The output signal Q is derived via the first output inverter 34 and the second output inverter 36 in dependence upon the slave signal at the slave node 12.

Considering FIGS. 9 and 10 these illustrate how during the retention mode a first path (FIG. 9) and a second path (FIG. 10) are provided in dependence upon the clock phase and in both cases serve to drive the slave node 12 to reflect the signal retained by the first slave inverter 14 operating in feedback with the first retention inverter 22 and stored at the remote slave node 20. This renders the output of the flip-flop circuit during the retention mode clock independent.

FIGS. 11 to 16 illustrate six further variants of the clock independent retention master-slave flip-flop circuits in accordance with the present techniques which utilise a first path and a second path to drive the output signal during the retention mode to have a value which is clock-phase independent and well defined.

The functioning of set/reset version for both high density and high speed is substantially the same as the basic (non-set/reset) implementation. The set/reset action happens as active-low or active-high depending upon the implementation.

Another property of the set/reset circuits is, if the set/reset happens in retention mode output Q will change accordingly provided the local power is on. Similarly, when set/reset are no more applied to the circuits in retention mode, the output Q will go back to the retained value if local power on. Thus, despite an applied set/reset, the retained value will not get overwritten if the mode of operation is retention.

To enable the above functionality, one extra P MOSFET and one extra N MOSFET are added to the tri-stated stack present in Master latch feedback path. Net RET is connected to the additional P MOSFET and input pin RETN is connected to the additional N MOSFET. If set/reset occurs in retention mode when CK=1, the nm node might change its value if the previous Master state is different, which in turn may also cause some erroneous output when the application of set/reset is discontinued.

Figure 11:
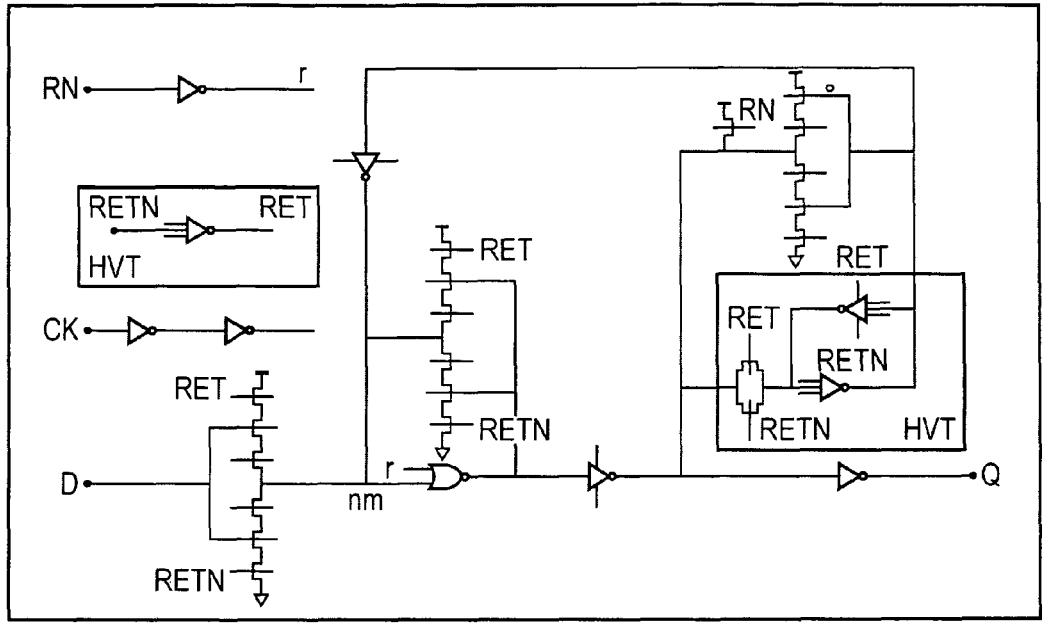
FIG. 11 schematically illustrates a high density variant of a D flip-flop circuit with active-low reset.
Figure 12:
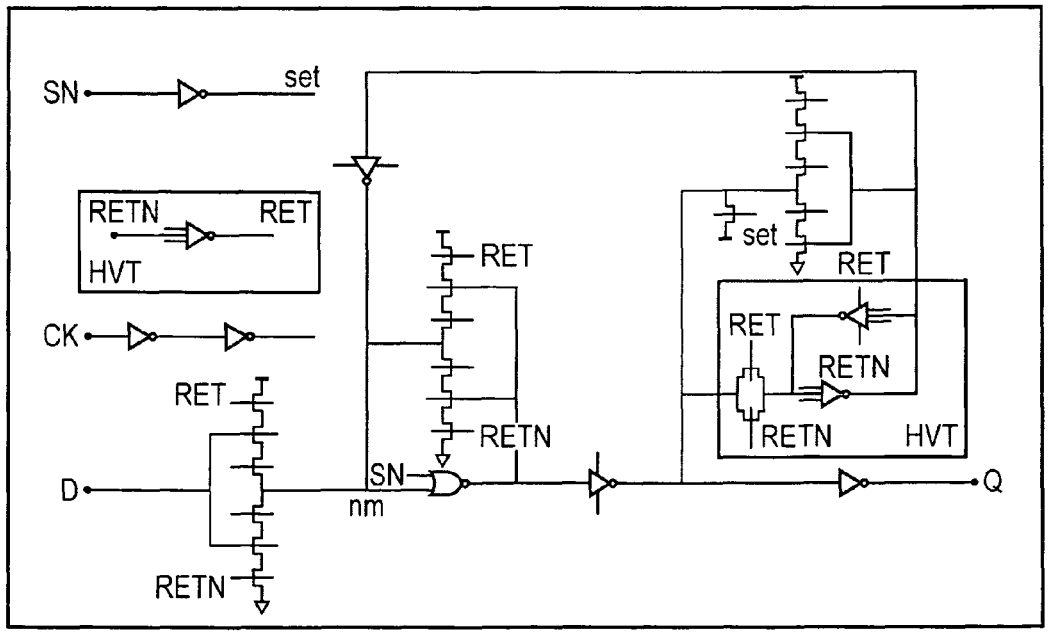
FIG. 12 schematically illustrates a high density variant of a D flip-flop circuit with active-low set.
Figure 13:
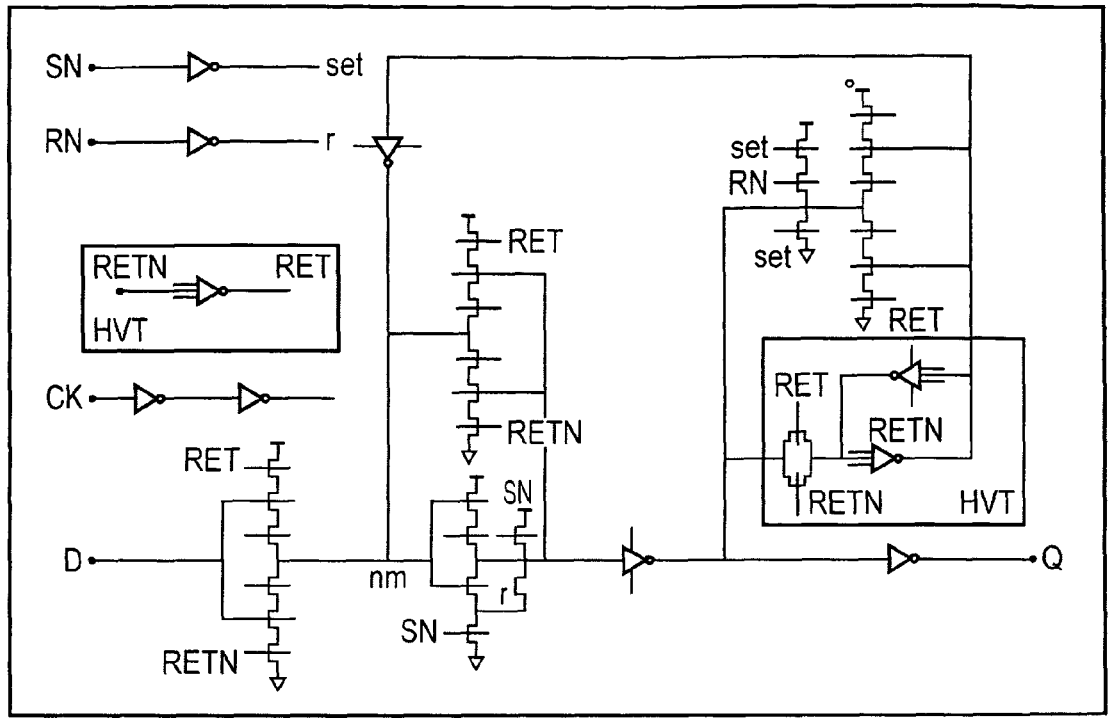
FIG. 13 schematically illustrates a high density variant of a D flip-flop circuit with active-low set-reset.
Figure 14:
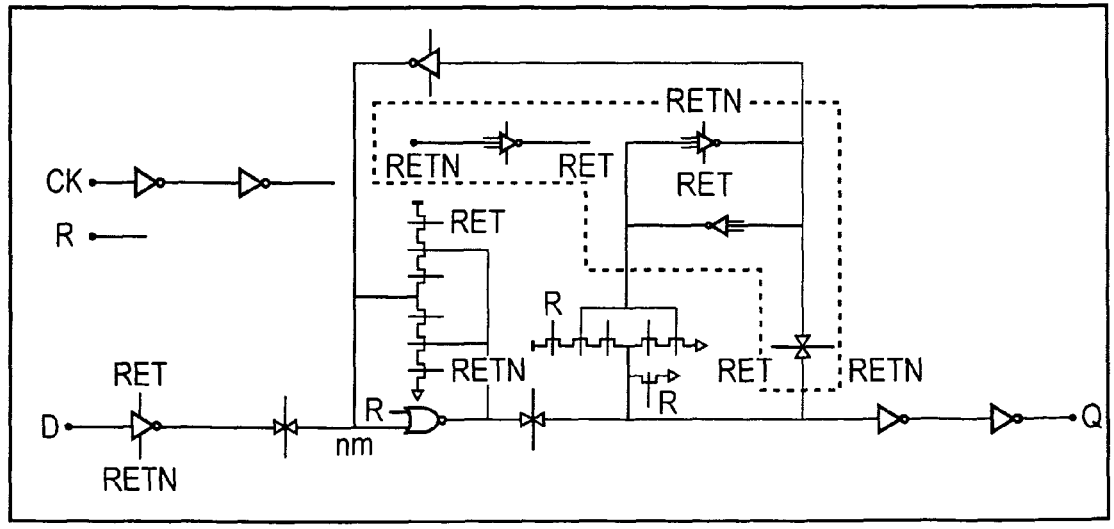
FIG. 14 schematically illustrates a high speed variant of a D flip-flop circuit with active-high reset.
Figure 15:
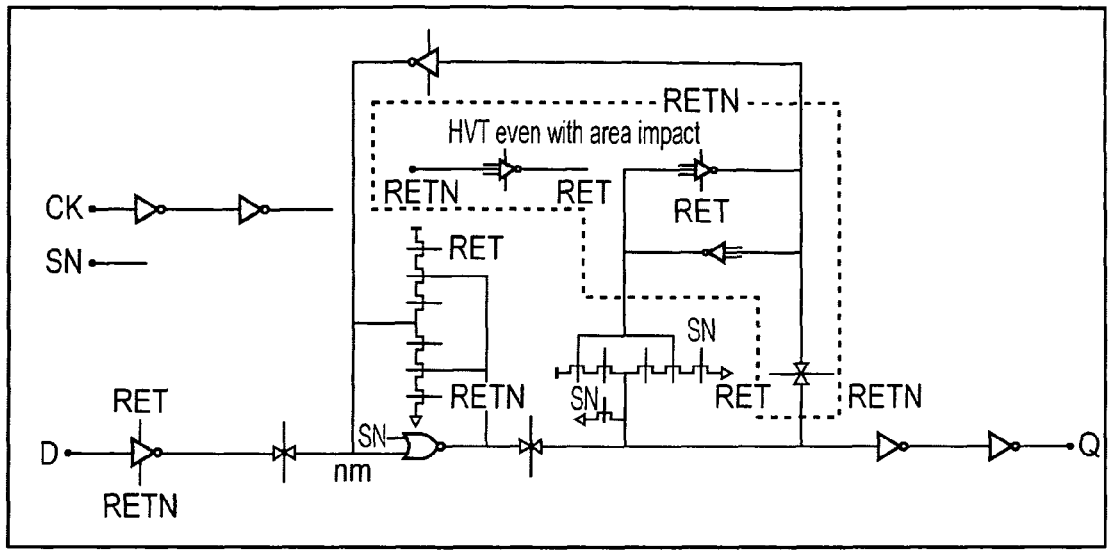
FIG. 15 schematically illustrates a high speed variant of a D flip-flop circuit with active-low set.
Figure 16:
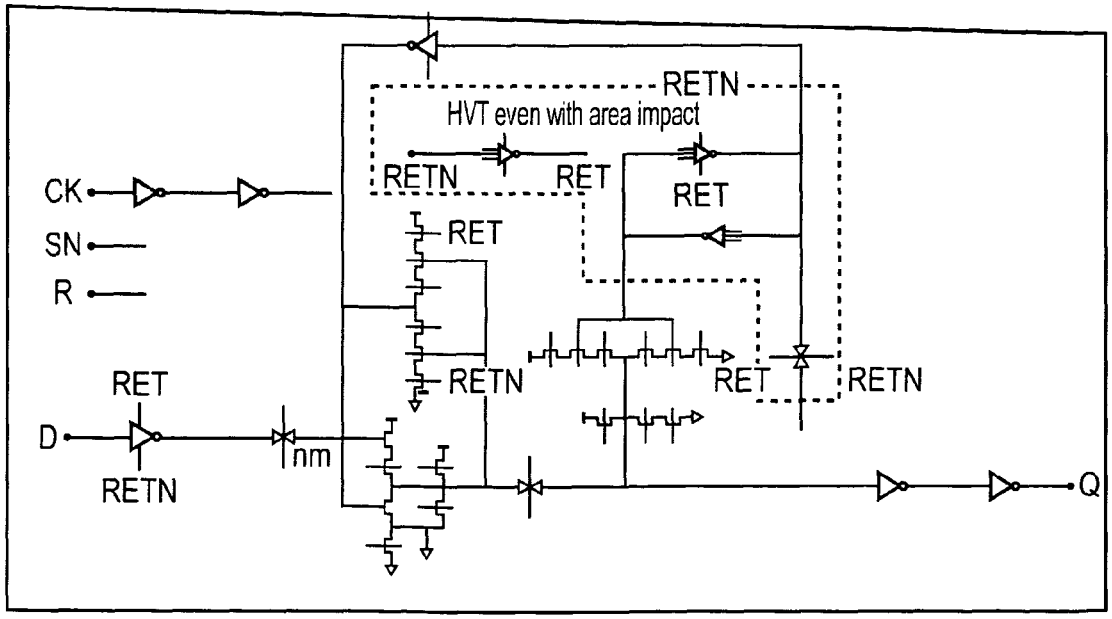
FIG. 16 schematically illustrates a high speed variant of a D flip-flop circuit with active-low set and active-high reset.

The example of FIG. 11 is a high density variant of a master-slave flip-flop circuit with active-low reset. FIG. 12 is a variant of a high density variant of a master-slave flip-flop with an active low set. FIG. 13 is a high density variant of a master-slave flip-flop with active low set and reset. FIG. 14 is a high speed variant of a master-slave flip-flop with active high reset. FIG. 15 is a high speed variant of a master-slave flip-flop with active low set. FIG. 16 is a high speed variant of a master-slave flip-flop with active low set and active-high reset.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A master-slave flip-flop circuit for receiving an input signal and for generating an output signal, said master-slave flip-flop circuit being controlled by a clock signal having a first phase and a second phase, having a normal mode of operation and a retention mode of operation and comprising:

a master stage configured to receive during said normal mode said input signal during said first phase of said clock signal and to store at a master node during said second phase of said clock signal a master signal with a value dependent upon said input signal;

control circuitry coupled to said master node and to a slave node and configured to isolate said slave node from said master node during said first phase of said clock signal and to drive said slave node during said second phase of said clock signal to have a slave signal with a value dependent upon said master signal, said output signal having a value dependent upon said slave signal;

a slave stage configured to receive during said normal mode said slave signal during said second phase of said clock signal and to store said slave signal at said slave node during said first phase of said clock signal; and retention circuitry coupled to said slave stage and configured to maintain said output signal during said retention mode, wherein said retention circuitry is configured such that:
(i) during said retention mode and said first phase of said clock signal, said retention circuitry drives said slave node so as to maintain said output signal via a first path; and
(ii) during said retention mode and said second phase of said clock signal, said retention circuitry drives said slave node so as to maintain said output signal via a second path passing through said master node and said control circuitry that drives said slave node during said normal mode, said second path being different from said first path.

2. A master-slave flip-flop circuit as claimed in claim 1, wherein said first path passes through a portion of said slave stage that drives said slave node during said normal mode.

3. A master-slave flip-flop circuit as claimed in claim 1, wherein said second path passes through a portion of said master stage that drives said master node during said normal mode.

4. A master-slave flip-flop circuit as claimed in claim 1, wherein said slave stage comprises first slave inverter circuitry configured to receive said slave signal from said slave node and to drive a remote slave signal on a remote slave node and second slave inverter circuitry configured to receive said remote slave signal from said remote slave node and, during said first phase of said clock signal, to drive said slave signal on said slave node.

5. A master-slave flip-flop circuit as claimed in claim 4, wherein said retention circuitry comprises slave transmission gate circuitry configured to transmit said slave signal from said slave node to said first slave inverter circuitry during said normal mode and to isolate said slave node from said first inverter circuitry during said retention mode.

6. A master-slave flip-flop circuit as claimed in claim 4, wherein said retention circuitry comprises first retention inverter circuitry configured to receive said remote slave signal from said remote slave node and, during said retention mode, to drive said slave signal on said slave node.

7. A master-slave flip-flop circuit as claimed in claim 6, wherein said master stage comprises first master inverter circuitry configured to receive said input signal and to drive said master signal on said master node and second master inverter circuitry configured to receive said master signal from said master node and, during said second phase of said clock signal, to drive said input signal received by said first master inverter circuitry.

8. A master-slave flip-flop circuit as claimed in claim 7, wherein said retention circuitry comprises second retention inverter circuitry configured to receive said remote slave signal from said remote slave node and, during said retention mode, to drive said input signal received by said first master inverter circuitry.

9. A master-slave flip-flop circuit as claimed in claim 1, wherein said control circuitry comprises control inverter circuitry coupled to said master node and to a slave node and configured to isolate said slave node from said master node during said first phase of said clock signal and to drive said slave node during said second phase of said clock signal.

10. A master-slave flip-flop circuit as claimed in claim 1, wherein said control circuitry comprises control transmission gate circuitry coupled to said master node and to a slave node and configured to isolate said slave node from said master node during said first phase of said clock signal and to drive said slave node during said second phase of said clock signal.

11. A master-slave flip-flop circuit as claimed in claim 1, further comprising an input gating circuitry configured to receive said input signal and:
(i) to transmit said input signal to said master stage during said normal mode during said first phase of said clock signal; and
(ii) to isolate said input signal from said master stage during any of said retention mode said second phase of said clock signal.

12. A master-slave flip-flop circuit as claimed in claim 11, wherein said input gating circuitry comprises transistor stack including transistors having gate signals being one of said input signal, said clock signal and a retention mode signal indicative of operation in one of said retention mode or said normal mode.

13. A master-slave flip-flop circuit as claimed in claim 11, wherein said input gating circuitry comprises input inverter circuitry configured to block said input signal during said retention mode and connected in series with input transmission gate circuitry configured to block said input signal during said second phase of said clock signal.

14. A master-slave flip-flop circuit as claimed in claim 9, further comprising an output inverter circuitry coupled to said slave node generates said output signal.

15. A master-slave flip-flop circuit as claimed in claim 10, wherein said output inverter circuitry comprising a first output inverter circuitry coupled to said slave node and connected in series with a second output inverter circuitry to generate said output signal.

16. A master-slave flip-flop circuit for receiving an input signal and for generating an output signal, said master-slave flip-flop circuit being controlled by a clock signal having a first phase and a second phase, having a normal mode of operation and a retention mode of operation and comprising:

master stage means for receiving during said normal mode said input signal during said first phase of said clock signal and for storing at a master node during said second phase of said clock signal a master signal with a value dependent upon said input signal;

control means coupled to said master node and to a slave node for isolating said slave node from said master node during said first phase of said clock signal and for driving said slave node during said second phase of said clock signal to have a slave signal with a value dependent upon said master signal, said output signal having a value dependent upon said slave signal;

slave stage means for receiving during said normal mode said slave signal during said second phase of said clock signal and for storing said slave signal at said slave node during said first phase of said clock signal; and retention means coupled to said slave stage means for maintaining said output signal during said retention mode, wherein said retention means is configured such that:
(i) during said retention mode and said first phase of said clock signal, said retention circuitry drives said slave node so as to maintain said output signal via a first path; and (ii) during said retention mode and said second phase of said clock signal, said retention circuitry drives said slave node so as to maintain said output signal via a second path passing through said master node and said control means that drives said slave node during said normal mode, said second path being different from said first path.

17. A method of operating a master-slave flip-flop circuit for receiving an input signal and for generating an output signal, said master-slave flip-flop circuit being controlled by a clock signal having a first phase and a second phase, having a normal mode of operation and a retention mode of operation, said method comprising the steps of:

receiving at a master stage during said normal mode said input signal during said first phase of said clock signal and storing at a master node during said second phase of said clock signal a master signal with a value dependent upon said input signal;

with control circuitry isolating a slave node from said master node during said first phase of said clock signal and driving said slave node during said second phase of said clock signal to have a slave signal with a value dependent upon said master signal, said output signal having a value dependent upon said slave signal;

receiving at a slave stage during said normal mode said slave signal during said second phase of said clock signal and storing said slave signal at said slave node during said first phase of said clock signal; and maintaining said output signal during said retention mode by:

(i) during said retention mode and said first phase of said clock signal, driving said slave node so as to maintain said output signal via a first path; and (ii) during said retention mode and said second phase of said clock signal, driving said slave node so as to maintain said output signal via a second path passing through said master node and said control circuitry that drives said slave node during said normal mode, said second path being different from said first path.

\* \* \* \* \*